(12) United States Patent
Ausserlechner et al.

(10) Patent No.: US 8,860,153 B2
(45) Date of Patent: Oct. 14, 2014

(54) SEMICONDUCTOR PACKAGES, SYSTEMS, AND METHODS OF FORMATION THEREOF

(71) Applicant: Infineon Technologies AG, Neubiberg (DE)

(72) Inventors: Udo Ausserlechner, Villach (AT); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 13/691,293

(22) Filed: Nov. 30, 2012

(65) Prior Publication Data

US 2014/0151697 A1    Jun. 5, 2014

(51) Int. Cl.
*H01L 27/14* (2006.01)
*H01L 29/82* (2006.01)
*H01L 29/84* (2006.01)
*H01L 25/16* (2006.01)
*H01L 21/50* (2006.01)

(52) U.S. Cl.
CPC .............. *H01L 25/16* (2013.01); *H01L 21/50* (2013.01)
USPC ..................... 257/414; 257/421; 257/E29.323

(58) Field of Classification Search
USPC ................... 257/414, 421, 422, 427, E29.323
See application file for complete search history.

(56) References Cited

U.S. PATENT DOCUMENTS

| 5,041,780 | A | 8/1991 | Rippel |
| 6,424,018 | B1 | 7/2002 | Ohtsuka |
| 6,504,356 | B2 | 1/2003 | Yao et al. |
| 6,995,315 | B2 | 2/2006 | Sharma et al. |
| 7,166,807 | B2 | 1/2007 | Gagnon et al. |
| 7,816,905 | B2 | 10/2010 | Doogue et al. |
| 2008/0297138 | A1 | 12/2008 | Taylor et al. |
| 2009/0218672 | A1 | 9/2009 | Nakamura et al. |
| 2011/0234215 | A1 | 9/2011 | Ausserlechner |
| 2012/0112365 | A1 | 5/2012 | Ausserlechner et al. |
| 2013/0300409 | A1* | 11/2013 | Deak et al. ................ 324/252 |

FOREIGN PATENT DOCUMENTS

DE    10 2006 026 148 A1    12/2007

OTHER PUBLICATIONS

World Wide Web, Radio-Electronics.com, www.radio-electronics.com, printed on Nov. 20, 2012, 2 pages.

* cited by examiner

*Primary Examiner* — Hoai V Pham
(74) *Attorney, Agent, or Firm* — Slater & Matsil, L.L.P.

(57) ABSTRACT

In accordance with an embodiment of the present invention, a semiconductor package includes a current rail comprising a first contact area and a second contact area, a first groove and a second groove, and a magnetic field generating portion. Along a current flow direction, the first groove is disposed between the first contact area and the magnetic field generating portion and the second groove is disposed between the magnetic field generating portion and the second contact area. The thickness of the current rail at the first groove is smaller than the thickness of the current rail at the first contact area.

41 Claims, 15 Drawing Sheets

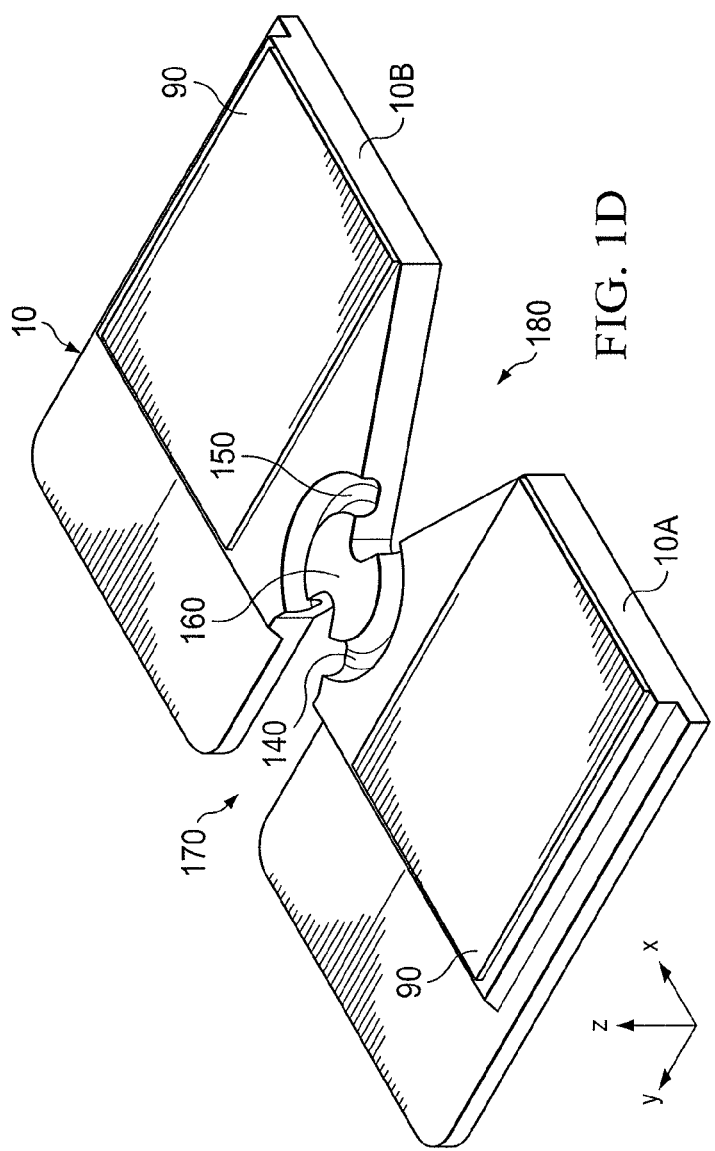
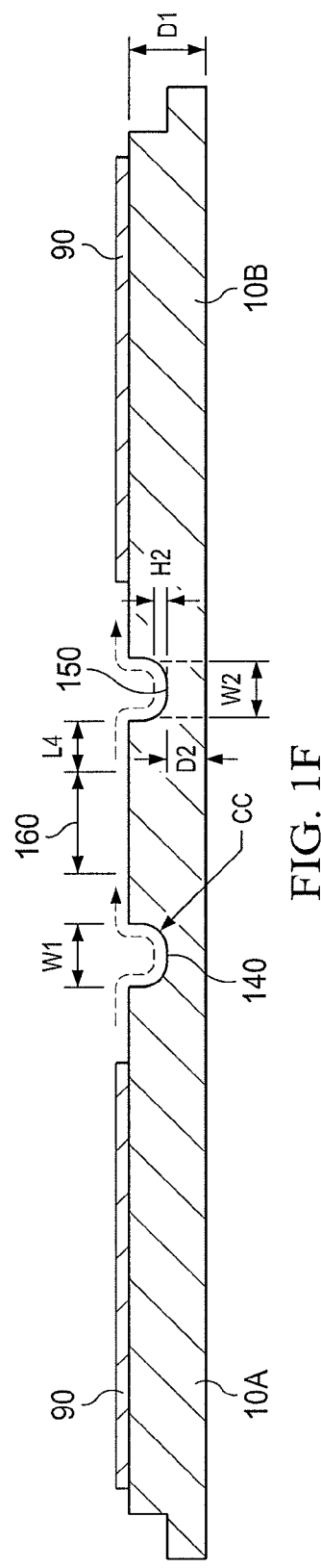
FIG. 1D
FIG. 1F

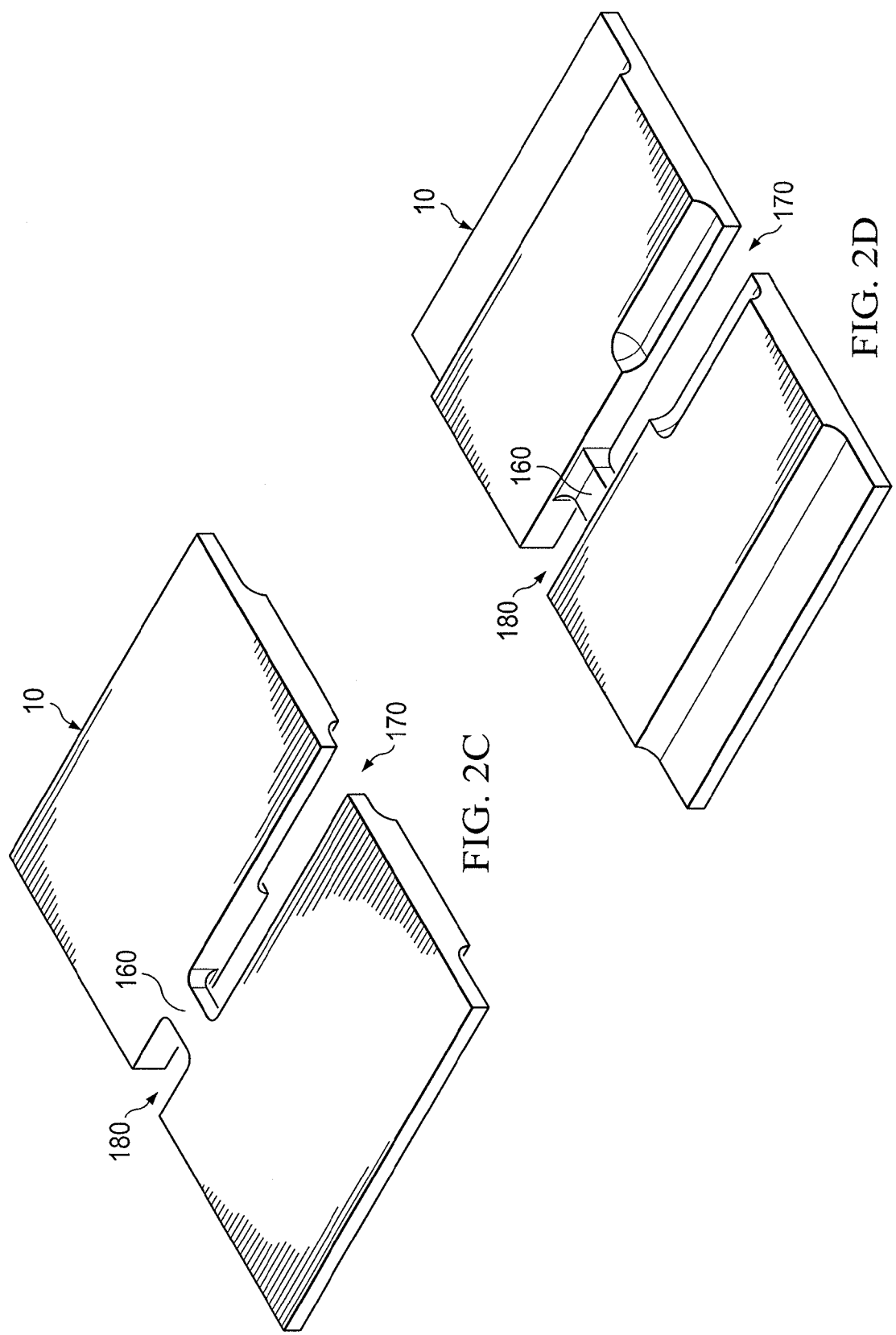

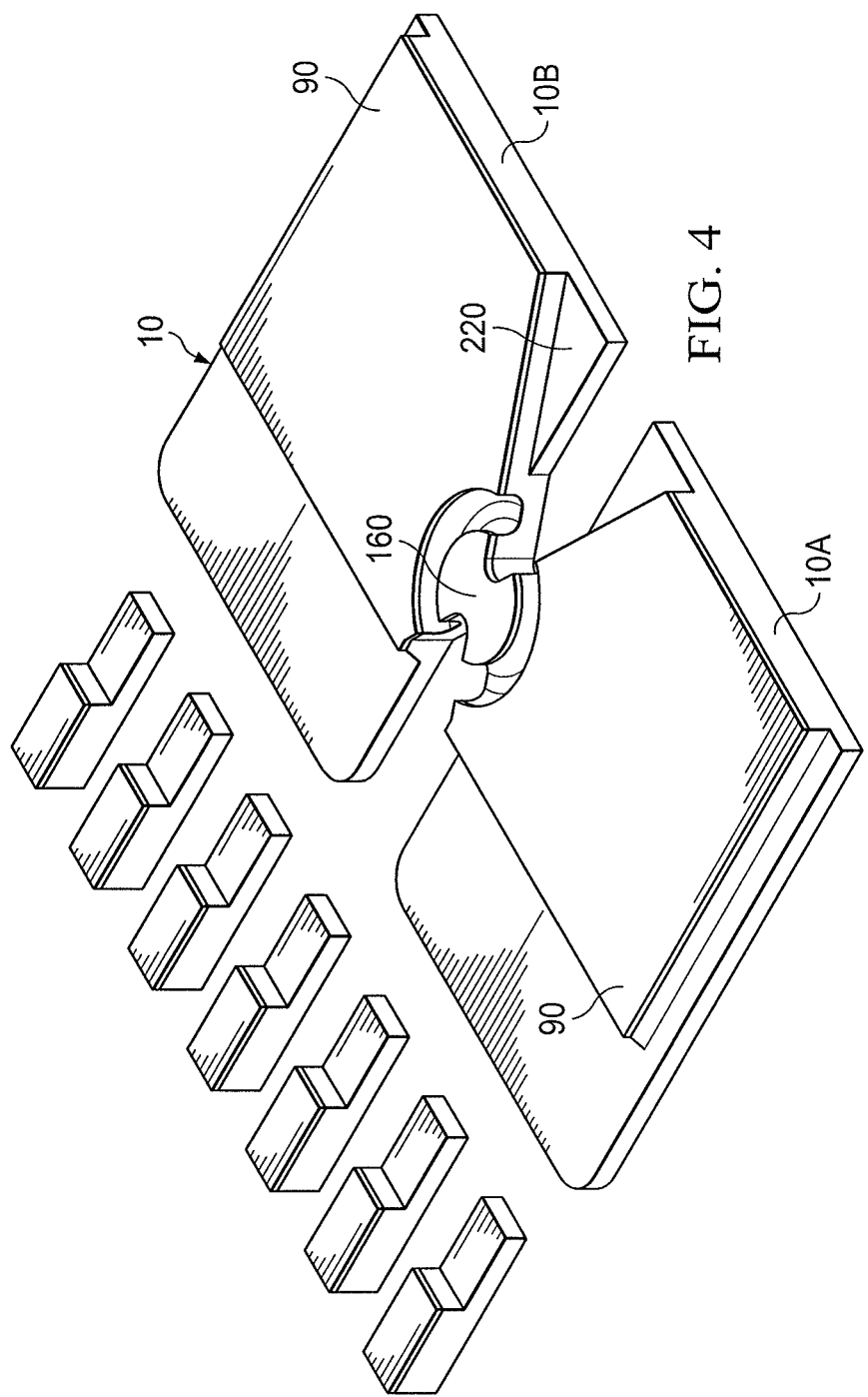

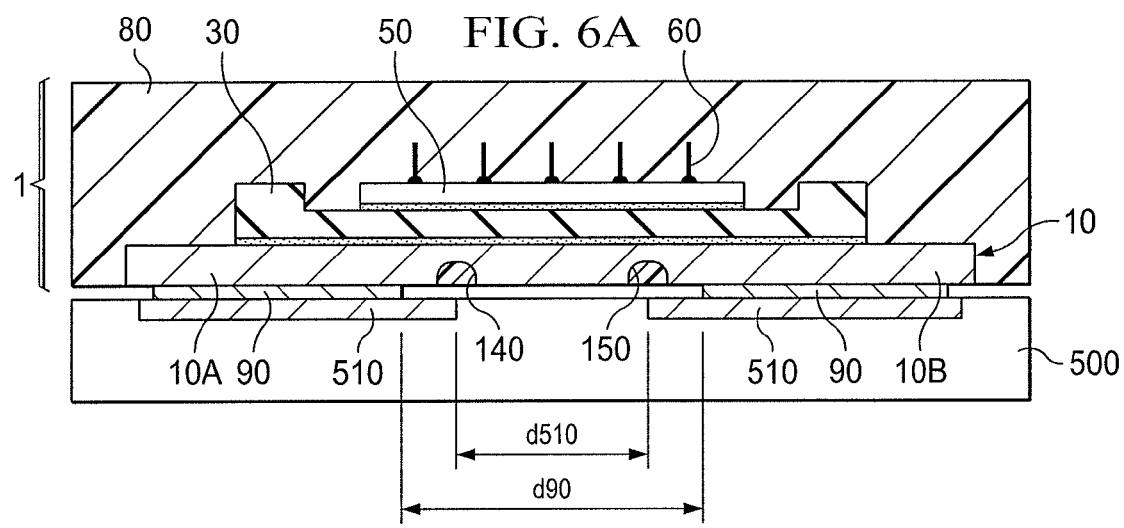
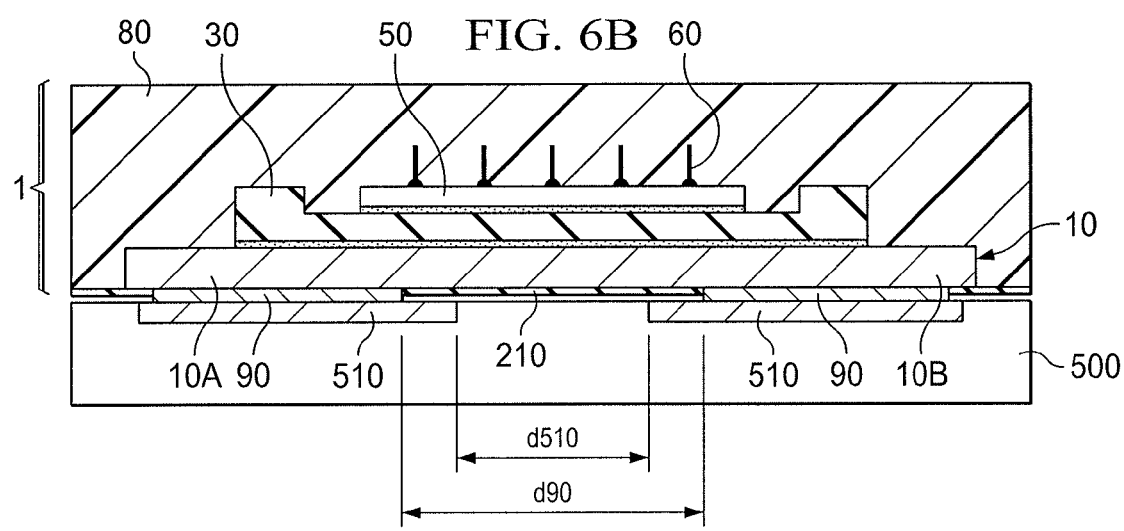

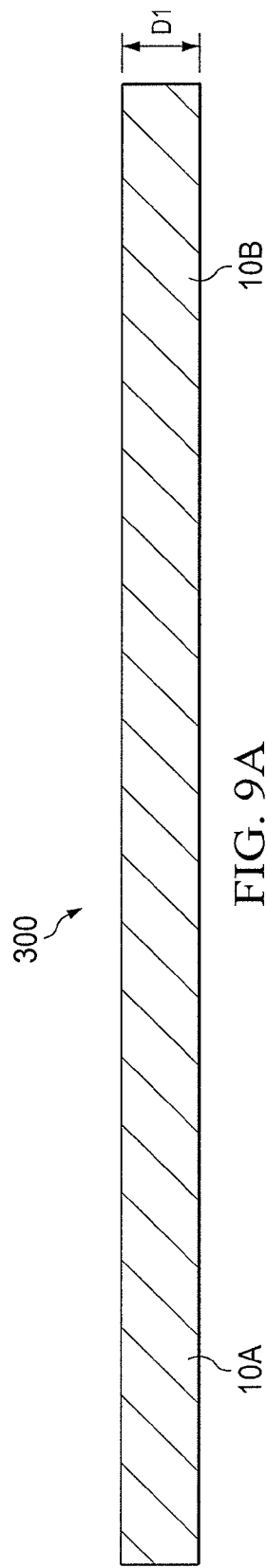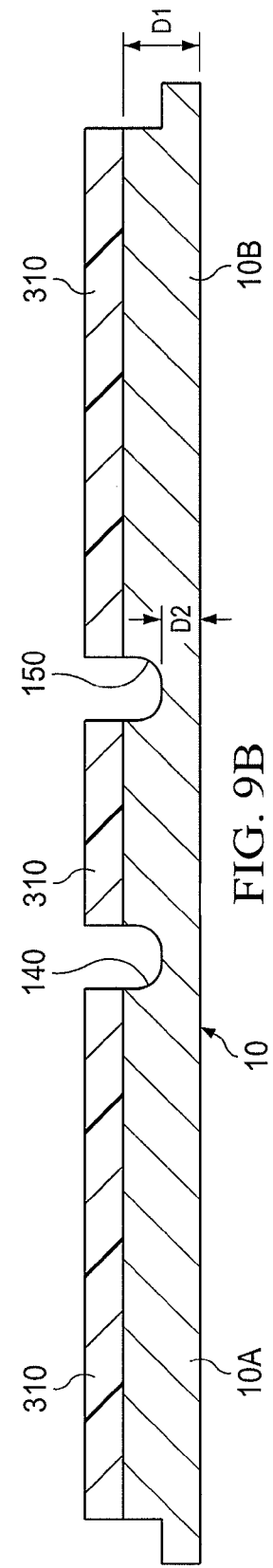

SEMICONDUCTOR PACKAGES, SYSTEMS, AND METHODS OF FORMATION THEREOF

TECHNICAL FIELD

The present invention relates generally to semiconductor devices, and more particularly to semiconductor packages, systems, and methods of formation thereof.

BACKGROUND

Sensors are used for a variety of applications such as thermal sensors, current sensors, magnetic field sensors, radiation sensors, light sensors etc. Many of these types of sensors are fabricated within a semiconductor die. The sensitivity of the sensor may depend on the distance between the physical source to the sensor within the semiconductor die. For example, current sensors may be used for over-current protection or for monitoring current flowing through a conductor. For such applications, Hall-sensors or similar sensors are widely used. Hall-sensors sense the magnetic field of the current and provide a voltage (Hall voltage) proportional to the intensity of the current. As the magnetic field decreases with increasing distance between the magnetic field sensor and the conductor carrying the current, the Hall-sensor has to be brought close to the conductor to improve the sensitivity to the magnetic field. Similarly, for a thermal sensor, the distance of the heat source to the sensor must be minimized to increase the sensitivity and reliability of the sensor. However, such designs may render the package susceptible to manufacturing defects. For example, the magnetic field measured may change due to small changes in the alignment of the chip relative to the current rail. Further, another challenge relates to product reliability due to the large currents flowing through the current rail.

SUMMARY OF THE INVENTION

In accordance with an embodiment of the present invention, a semiconductor package comprises a current rail comprising a first contact area and a second contact area, a first groove and a second groove, and a magnetic field generating portion. Along a current flow direction, the first groove is disposed between the first contact area and the magnetic field generating portion and the second groove is disposed between the magnetic field generating portion and the second contact area. The thickness of the current rail at the first groove is smaller than the thickness of the current rail at the first contact area.

In accordance with an alternative embodiment of the present invention, a semiconductor package comprises a current rail having contact pad regions and a magnetic field generating portion. A semiconductor chip is disposed over the current rail. The semiconductor chip comprises a magnetic field sensor, which is proximate the current rail. A package body secures the current rail and the semiconductor chip. Portions of a back surface of the current rail are exposed at a bottom surface of the package body. An anti-solder layer covers parts of the exposed portions of the back surface of the current rail.

In accordance with an alternative embodiment of the present invention, a system comprises a circuit board having solder pads, and a semiconductor package coupled to the circuit board through the solder pads. The semiconductor package comprises a current rail having contact pad regions, and a semiconductor chip disposed over the current rail. The semiconductor chip comprises a magnetic field sensor proximate the current rail. A package body secures the current rail and the semiconductor chip. Portions of a back surface of the current rail are exposed at a bottom surface of the package body facing the circuit board. An anti-solder layer covers parts of the exposed portions of the back surface of the current rail. The solder pads of the circuit board are disposed under and coupled to the contact pad regions.

In accordance with another alternative embodiment of the present invention, a method of forming a semiconductor package comprises etching a magnetic field generating portion in a lead frame substrate, and etching a plurality of grooves in the lead frame substrate. The plurality of grooves are proximate the magnetic field generating portion. The plurality of grooves has a second thickness less than a first thickness of the lead frame substrate. In a plan view, the magnetic field generating portion is disposed between a first groove of the plurality of grooves and a second groove of the plurality of grooves. A semiconductor chip is attached over the lead frame substrate. The semiconductor chip is proximate the magnetic field generating portion.

In accordance with yet another alternative embodiment of the present invention, a method of forming a semiconductor package comprises providing a lead frame substrate having a magnetic field generating portion, and attaching a semiconductor chip over the magnetic field generating portion. The semiconductor chip comprises a magnetic field sensor disposed proximate the magnetic field generating portion. A package body securing the lead frame substrate and the semiconductor chip is formed. Portions of a back surface of the lead frame substrate are exposed at a bottom surface of the package body. An anti-solder layer is formed under parts of the exposed portions of the back surface of the lead frame substrate.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1F, illustrates an embodiment of the semiconductor package illustrating a groove formed within a current rail, wherein FIG. 1A is a plan view, FIGS. 1B and 1C are cross-sectional views, FIG. 1D is a projection view of a current rail, FIG. 1E is a plan view of the current rail, and FIG. 1F is a cross-sectional view of the current rail;

FIG. 2, which includes FIGS. 2A-2D, illustrates problems with conventional current rails as identified by the inventors, wherein FIG. 2A illustrates a cross-sectional view of a first current rail design and FIG. 2B illustrates a top view of the first current rail design, wherein FIG. 2C is a projection view from the top and FIG. 2D of a projection view from the bottom of another conventional current rail;

FIG. 4 illustrates a projection view of the current rail of a semiconductor package having a different design in accordance with an alternative embodiment of the invention;

FIG. 5, which includes FIGS. 5A-5C, illustrates a semiconductor package having an anti-solder layer in accordance with an alternative embodiment of the present invention, wherein FIG. 5A illustrates a top view, FIG. 5B illustrates a cross-sectional view, and FIG. 5C illustrates a further magnified cross-sectional view of the current rail;

FIG. 6, which includes FIGS. 6A and 6B, illustrate cross-sectional views of the semiconductor package mounted over a printed circuit board in accordance with embodiments of the invention, wherein FIG. 6A illustrates a semiconductor package having a plurality of grooves or channels while FIG. 6B illustrates a semiconductor package having an anti-solder layer;

FIG. 7, which includes

FIG. 8, which includes

FIG. 9, which includes FIGS. 9A-9C, illustrates a semiconductor package during various stages of fabrication in accordance with embodiments of the present invention;

FIG. 10, which includes FIGS. 10A and 10B, illustrates an alternative embodiment of the present invention using a current rail having no constriction, wherein FIG. 10 illustrates a top view while FIG. 10B illustrates a cross-sectional view;

FIG. 11, which includes FIGS. 11A and 11B, illustrates an alternative embodiment of the current rail having linear grooves, wherein FIG. 11A illustrates a cross-sectional view and FIG. 11B illustrates a top view; and FIG. 12, which includes FIGS. 12A and 12B, illustrates a current rail having a half etched constriction in accordance with an alternative embodiment of the invention, wherein FIG. 12A illustrates a cross-sectional view while FIG. 12B illustrates a top view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of a semiconductor package including a current rail will be described using FIG. 1. Alternative structural embodiments of the semiconductor package including the current rail will be described using FIG. 5. Alternative structural embodiments of the current rail will be described using FIGS. 3, 4, 7, and 8. Embodiments of a semiconductor package mounted over a circuit board will be described using FIG. 6.

Figure 1A:
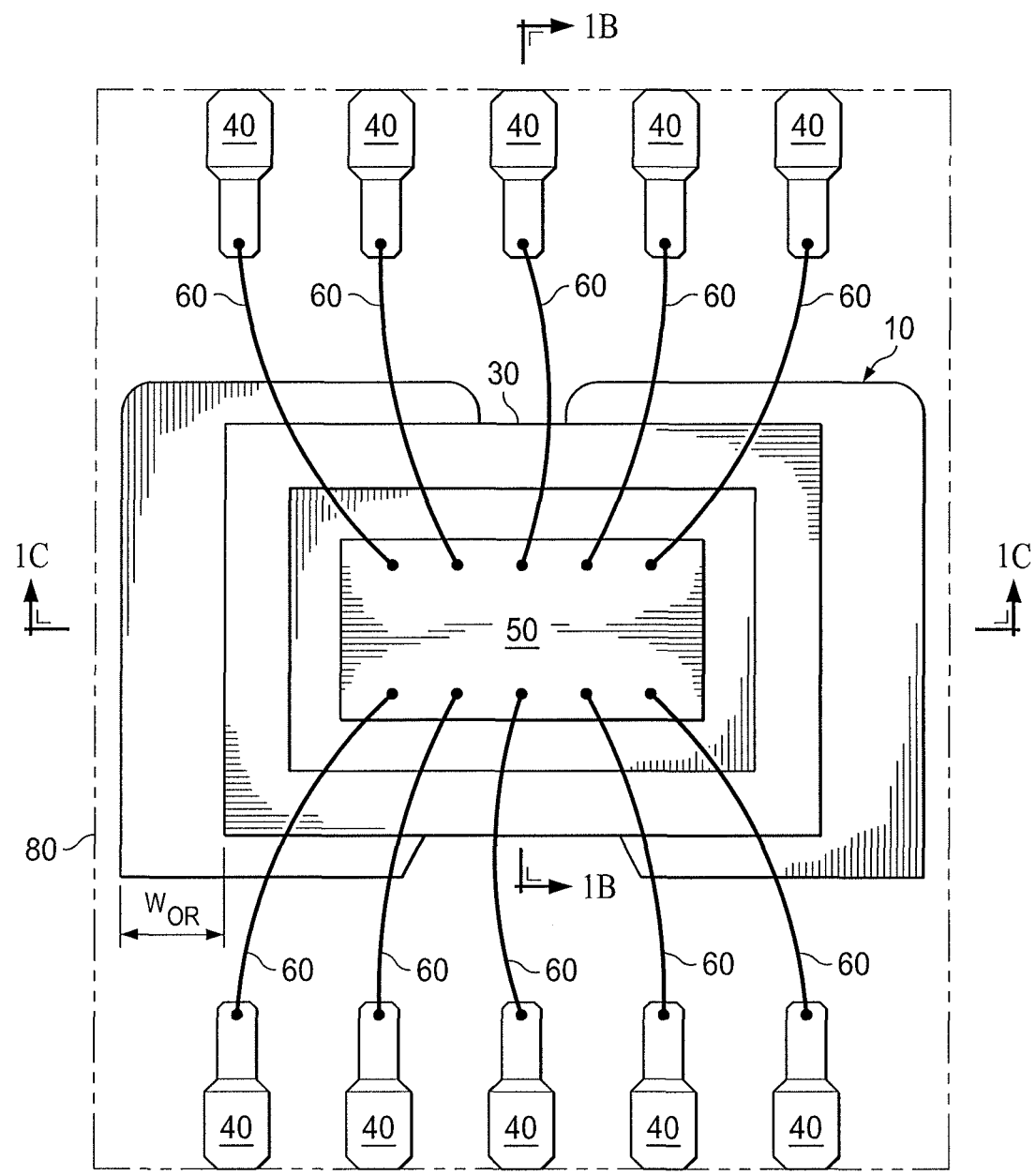
Figure 1B:
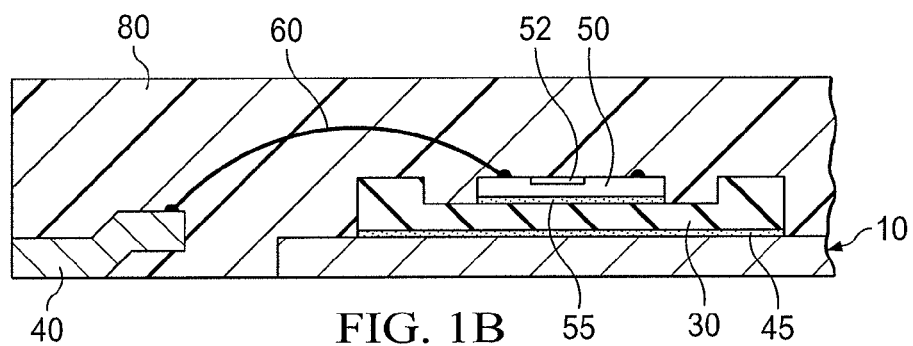
Figure 1C:
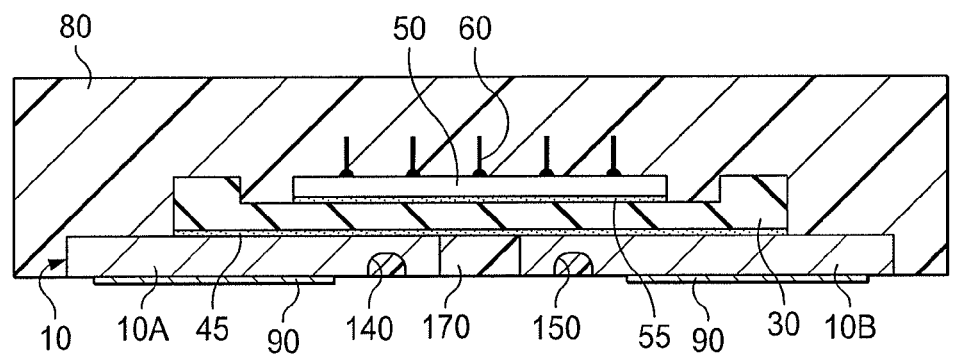
Figure 1E:
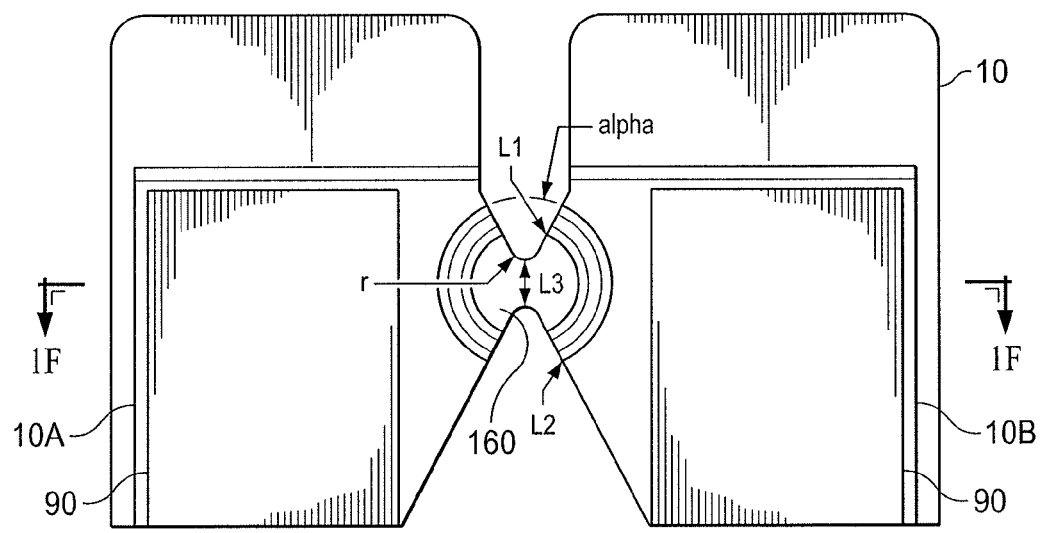

FIG. 1, which includes FIGS. 1A-1F, illustrates an embodiment of the semiconductor package illustrating a groove formed within a current rail. FIG. 1A is a plan view, FIGS. 1B and 1C are cross-sectional views, FIG. 1D is a projection view of a current rail, FIG. 1E is a plan view of the current rail, and FIG. 1F is a cross-sectional view of the current rail.

Referring to FIG. 1A, a sensor chip 50 is disposed within a package body 80. The sensor chip 50 is mounted over a current rail 10. The sensor chip 50 may be adapted to measure a current flowing through the current rail 10. The sensor chip 50 comprises a magnetic field sensor 52 (e.g., FIG. 1B) and optionally an evaluation unit.

The package body 80 may be a mold compound, an encapsulant not formed using a mold compound, a sealant not formed using a mold compound, or other materials. Further, the package body 80 is optional in various embodiments and is used for illustration purposes. The package body 80 covers the exposed surfaces of the sensor chip 50 such that the sensor chip 50 is hermetically sealed from the environment in one embodiment.

The sensor chip 50 may be coupled to a plurality of leads 40 through interconnects 60 as illustrated in FIGS. 1A and 1B.

An isolating structure 30 physically separates and electrically insulates the sensor chip 50 from the current rail 10 (FIGS. 1B and 1C). The isolating structure 30 prevents the large currents flowing through the current rail 10 from entering into the sensor chip 50. Thus, the sensor chip 50 senses the flow of current within the current rail 10 due to electromagnetic effect. The sensor chip 50 may be disposed on the isolating structure 30 in some embodiments. In one or more embodiments, the isolating structure 30 comprises a container. The sensor chip 50 may be attached to the isolating structure 30 using a chip adhesive layer 55 (FIG. 1B).

The isolating structure 30 overlaps the sensor chip 50 along its entire perimeter in order to guarantee a long enough creepage distance between the current rail 10 and the sensor chip 50 for the purpose of voltage isolation. The current rail 10 may be a part of a leadframe and die paddle in one or more embodiments.

In various embodiments, the current rail 10 may be attached to the isolating structure 30 using a solder element, an adhesive, a bolt, may be snapped into place, or attached using other methods. The current rail 10 may be attached to the isolating structure 30 using an adhesive foil 45 in one embodiment.

As illustrated in FIGS. 1C and 1D, the current rail 10 may comprise a first contact pad 10A, a second contact pad 10B, and a constriction 160, which is a magnetic field producing region. The constriction 160 is arranged between the first contact pad 10A and the second contact pad 10B and within the electrical path between the first contact pad 10A and the second contact pad 10B. The sensor chip 50 is adapted to measure the amount of current flowing through the current rail 10 by measuring the magnetic field produced by the flowing current at the constriction 160.

In one or more embodiments, the current rail 10 is a flat current rail such that the thickness along a z-direction (e.g., in FIG. 1D) is smaller than the lateral dimension. In one or more embodiments, the sensor chip 50 may have lateral dimensions (x,y) and a thickness dimension (z) such that the current rail 10 after being attached to the sensor chip 50 (via isolation or directly) may have a thickness in a direction that is parallel to the thickness direction of the semiconductor chip 50. In various embodiments, the field generating part may be near the constriction 160 and thus near at least one magnetic field sensor element 52.

The constriction 160 is formed between a first notch 170 and a second notch 180 in various embodiments. The current rail 10 may have other shapes in alternative embodiments. The thickness of the constriction 160 along the vertical direction (z-axis in FIG. 1D) is about the same as the current rail 10. However, the cross-sectional area for the flow of current is reduced dramatically due to the presence of the first and the second notches 170 and 180. In alternative embodiments, the thickness of the constriction 160 along the vertical direction (z-axis in FIG. 1D) may be lower than the thickness of the rest of the current rail 10.

In various embodiments, the cross-sectional area for the flow of current at the constriction 160 is at least 1/10 of the cross-sectional area for the flow of current at the first contact pad 10A. The increased current crowding produces a stronger magnetic field, which is sensed at the sensor chip 50.

Referring to FIG. 1D, the current rail 10 further includes a first groove 140 and a second groove 150. The first groove 140 is located opposite to the second groove 150 with the constriction 160 disposed between them. In one or more embodiments, the lateral position of the first and the second grooves 140 and 150 is such that it is between the contact area (e.g., a first contact pad 10A, which is at a solder junction between current rail 10 and external conductor such as e.g. the trace on a printed circuit board) and the field generating portion of the current rail 10 (e.g., the constriction 160). Thus also at least one magnetic field sensor is placed between the first and the second grooves 140 and 150 in a plan view. In a cross sectional view, the location of the first and the second grooves 140 and 150 may be essentially at the same z-coordinate as the interface between the solder 90 and the first contact pad 10A or the second contact pad 10B in FIG. 1D.

In various embodiments, the first groove 140 and the second groove 150 are designed to prevent the flow of solder material from the first contact pad 10A or the second contact pad 10B. For example, the first groove 140 may prevent solder material from flowing and reaching the second contact pad 10B (short) or form a layer over the constriction 160 (partial short).

Referring to FIG. 1E, the first groove 140 has an inner length L1 and an outer length L2 separated by the width of the groove. In one or more embodiments, the inner length L1 and the outer length L2 may vary from about 10 mm to about 0.1 mm, and about 1 mm in one embodiment. The length of the constriction L3 may be about 100 μm to about 3 mm, and about 200 μm in one embodiment. The tips of the first notch 170 and the second notch 180 may have a radius of curvature of about 50 μm to about 500 μm, and about 100 μm in one embodiment.

Referring to FIG. 1F, the current rail 10 may comprise first thickness (D1) (e.g., about 200 μm as an illustration) and may include some regions that are half the first thickness (a second thickness D2). The constriction may also be at the first thickness, which may be the original thickness of the leadframe forming the current rail 10. The first and the second grooves 140 and 150 may have half the first thickness (D1/2). Due to the curvature of the sidewalls of the grooves, the ratio of the first width W1 to the second width W2 at a height h2 above the bottom may be about 10:1 to about 2:1 in various embodiments. The ratio of the first width W1 to the second width W2 may be about 3:1 in one embodiment. Similarly, the ratio of the thickness of the current rail at the grooves (D2) to the second width W2 may be about 5:1 to about 1:5 in various embodiments, and about 1:1 in one embodiment. Due to manufacturing limitations, in one or more embodiments, the first width W1 may be equal to the length D1-D2 and the curved contour CC in the cross-section of FIG. 1F may be close to a semi-circle.

In various embodiments, the electrical resistance of the material in the first groove 140 or the second groove 150 is smaller than a corresponding electrical resistance of the material in the constriction 160. In various embodiments, the cross-sectional area of the current rail 10 remaining under the first groove 140 or the second groove 150 along a surface perpendicular to the current flow direction is larger than a cross-sectional area of the constriction 160. In other words, the cross-sectional areas may be approximated to the inequality $L3 \times D1 < L2 \times D2$. This ensures that the first groove 140 or the second groove 150 does not introduce a shift in the measured magnetic field due to higher current crowding or an increase in resistance to the flow of the primary current. In the semiconductor package (e.g., FIGS. 1A-1C), the first and the second grooves 140 and 150 are filled with the package body 80, which helps to stop the flow of solder from the nearby contact pad regions when the package is attached to another component such as a circuit board. A wider groove may help to prevent short but may also increase the electrical or thermal resistance of the current rail.

FIG. 1F illustrates a cross-sectional view of the current rail 10 and illustrates the groove's resistance to the flow of the solder 90 from over the first contact pad 10A towards the constriction 160 (shown by dashed arrows). Further, the grooves are filled with material of the package body 80, which prevents the solder material from flowing.

Further structural features and advantage of the grooves as described in various embodiments of the present invention will be described below after identifying the problems with traditional current rail designs.

Figure 2A:
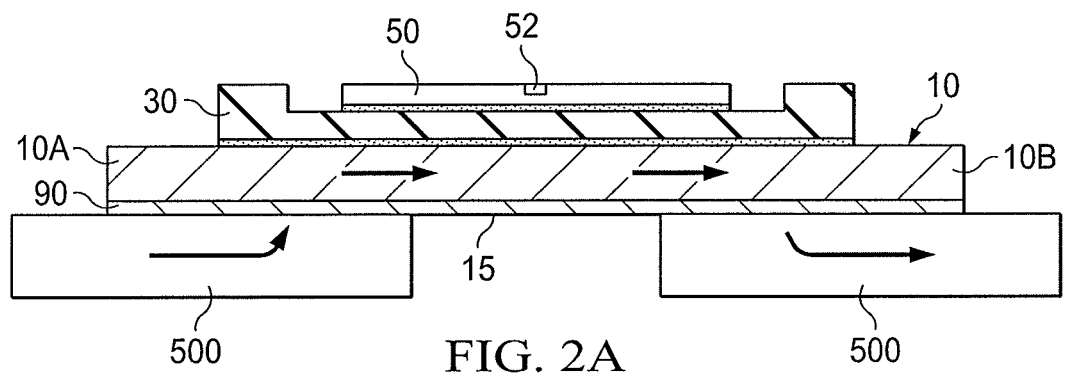
Figure 2B:
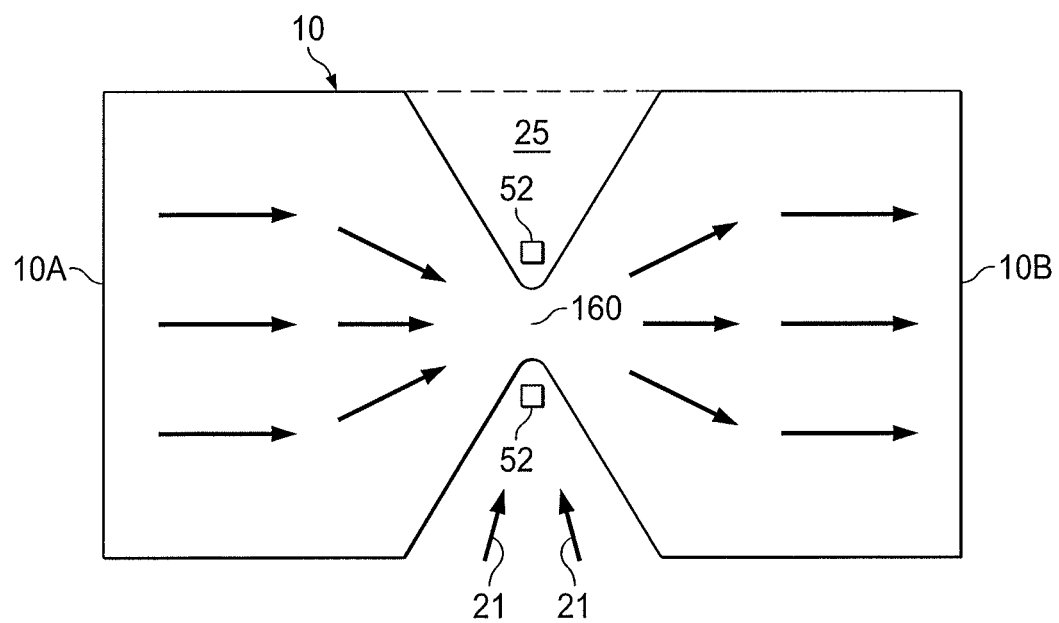

FIG. 2, which includes FIGS. 2A-2D, illustrates problems with conventional current rails as identified by the inventors. FIG. 2A illustrates a cross-sectional view of a first current rail design and FIG. 2B illustrates a top view of the first current rail design. FIG. 2C is a top view and FIG. 2D of a bottom view of another conventional current rail.

FIG. 2A illustrates in a cross sectional view a current rail 10 mounted over a circuit board 500 (only the current traces of the circuit board are drawn). The white arrows denote the current flow direction. The sensor chip 50 comprising the magnetic field sensor 52 is disposed over the current rail 10. In the absence of the grooves, as illustrated in FIG. 2A, while forming solder 90, the solder material from the first contact pad 10A may form a short 15 to the second contact pad 10B (or to the exposed part of the current rail 10 on the opposite side across the lateral opening).

A part of the current flowing through the contact pad 10A may be diverted through the solder material due to the short 15. The diversion of the current may be significant especially if the cross-sectional area of the short 15 is significant. Although the current rail is typically made from copper and thus it is more conductive than the solder material, the presence of a short 15 may nevertheless change the magnetic field being produced by the flowing current, which may impact the accuracy of the current sensing process. For example, the short 15 may be ten times less conductive than the current rail 10, a few percent of the current flow may still be diverted through the short 15, which may result in about a 1% difference in magnetic field.

Further, current flowing through the solder material may cause reliability issues during the lifetime of the product, for example, due to electro-migration. This lifetime drift due to electro-migration may add a few percent error. As a consequence, the sensitivity of the sensor may change during the lifetime of the product.

FIG. 2B illustrates a plan view of a current rail 10 during the formation of the package body 80. The encapsulant material used to form the package body 80 flows into the first notch 170 from one side (arrows 21) during a molding process such as transfer molding. The encapsulant material's flow may be blocked at the constriction 160 and a void 25 may occur in the notch behind the constriction if the constriction 160 has the same thickness as the remaining current rail. The presence of such a void 25 is a reliability risk for the product. Further, if transfer molding without pre-evacuation of the mold tool is used, a bubble may be formed in the second notch 180 because trapped air is caught between the mold tool and the isolating structure 30.

FIG. 2C is a top view and FIG. 2D of a bottom view of another conventional current rail. Here, the constriction 160 has a smaller thickness (half thickness) along the z-axis and a longer length along the x-axis than the designs of FIGS. 2A and 2B. Consequently, during the molding process, the encapsulant material may enter the first notch 170 between the two large contact portions of the current rail 10 pushing the gas underneath the constriction 160. Then, the encapsulant material may flow underneath the constriction 160 (due to the smaller thickness) and fill up the opposite second notch 180. This design prevents the formation of voids unlike FIG. 2B.

The current rails along the edges have half etched regions or recesses to prevent solder shorting. Consequently, due to the longer length of the constriction 160 and the recesses, shorts due to the solder reflow may also be avoided.

However, the inventors have identified the following problems with the designs illustrated in FIGS. 2C and 2D. Large mechanical stress may develop in the constriction due to the longer length and smaller thickness used to prevent the above problems. For example, this increase in stress may be due to the mismatch of coefficient of thermal expansion between the conductive material of the current rail 10 and the package body 20. Similarly, the package body 20 may swell or shrink due to moisture from the outside environment resulting in mechanical stress in the constriction 160. The combined mechanical and electric stress may lead to changes in the geometry of the constriction (cracks) and finally lead to a lifetime drift of the current sensor. Further, the current rail 10 is exposed right up to the edge where the constriction 160 begins. The solder is likely to wet the complete exposed surface of the contact area so that it approaches the constriction 160 up to this point. This may impact the current density distribution near the constriction 160 due to variations in thickness and degree of wetting of the solder. Further, a longer constriction 160 increases the losses at high currents because of the increase in ohmic resistance of the current rail 10.

These problems identified by the inventors in FIG. 2 and others may be overcome by embodiments of the present invention. For example, as described in FIG. 1, the first and the second grooves 140 and 150 may prevent solder material from shorting. FIG. 2B also illustrates that two magnetic field sensors 52 may be placed on each side of the constriction 160. This may be used to suppress magnetic background disturbances by using a differential measuring principle. Advantageously, the constriction 160, for example, as illustrated in FIG. 1D, has a larger cross section than the constriction in FIGS. 2C-2D without having larger spacing of sensor elements. Therefore, the material in the constriction 160 has about the same thickness as rest of the current rail 10, i.e., has a full thickness and is not etched to half thickness. The first groove 140 and the second groove 150 guide the flow of the encapsulant material from the first notch 170 to the second notch 180 and avoid forming voids. The fourth distance L4 (FIG. 1F) of the first groove 140 from the constriction 160 may be varied so that the resistance and the mechanical stress is not unduly large at the grooves.

Consequently, if an encapsulant material is injected in the mold tool and flows into the first notch 170, the encapsulant material may push the gas out through the first and the second grooves 140 and 150. Next, the encapsulant material may also flow through the first and the second grooves 140 and 150 to fill the second notch 180. Also only the small part of the second notch 180 that has full thickness D1 (e.g., FIG. 1F) may need to be filled by encapsulant material coming through these grooves, the rest may be filled by the encapsulant material that comes from left and right below the half-etched large wings of the structure.

The fourth distance L4 of the grooves from the edge of the constriction 160 is chosen large enough so that the current density and the mechanical stress at the grooves is not an issue. On the other hand, if the first and the second grooves 140 and 150 become too long, the encapsulant material may not be able to flow through easily. However, the first and the second grooves 140 and 150 may be wider if the length has to be increased. However, this may increase the electrical resistance for the primary current flowing through the current rail 10.

In various embodiments, the grooves may not be straight lines but rather may include curvature (e.g., circular or elliptical in shape when viewed from the top). For example, the stiffness of the current rail 10 against out-of-plane bending is higher if the first and the second grooves 140 and 150 are curved. The electrical and thermal resistance may also be lower if the current streamlines and heat flux-lines are at about 90° through the first and the second grooves 140 and 150. The constriction 160 is designed to be a kind of point source and all streamlines pass through it roughly radially.

Figure 3:
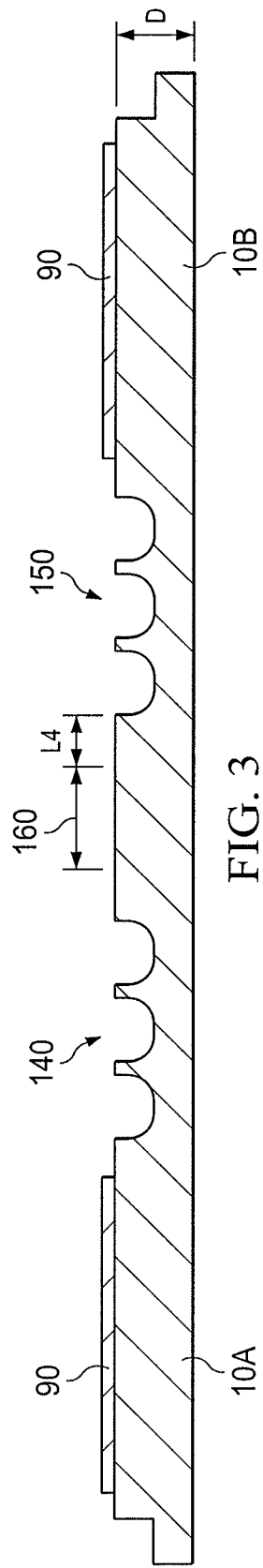
FIG. 3 illustrates a cross-sectional view of a current rail of a semiconductor package having multiple grooves in accordance with an alternative embodiment of the invention.

FIG. 3 illustrates a cross-sectional view of a current rail of a semiconductor package in accordance with an alternative embodiment of the invention.

In one or more embodiments, the number of grooves and the depth of the grooves may be varied. For example, in FIG. 3, each groove includes a plurality of channels having a depth less than the grooves illustrated in FIG. 1. The multiple grooves may help to stop the flow of solder 90 from the contact pad regions while the shallower groove may help to minimize increase in thermal or electrical resistances.

FIG. 4 illustrates a projection view of the current rail of a semiconductor package in accordance with an alternative embodiment of the invention.

As illustrated in FIG. 4, in an alternative embodiment, the exposed back surface of the current rail 10 may have a complex shape. For example, some of the edges of the current rail 10 may be straight while other edges may be angled and include a curvature. FIG. 4 illustrates an area exposed to the solder 90 while another area 220 of the back surface of the current rail 10 remains within the package body.

Figure 5A:
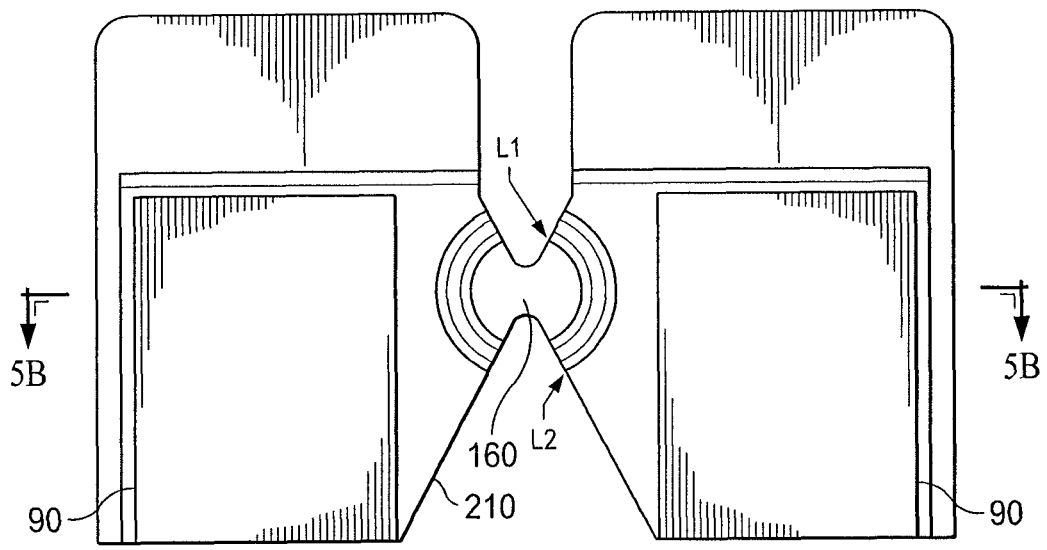
Figure 5B:
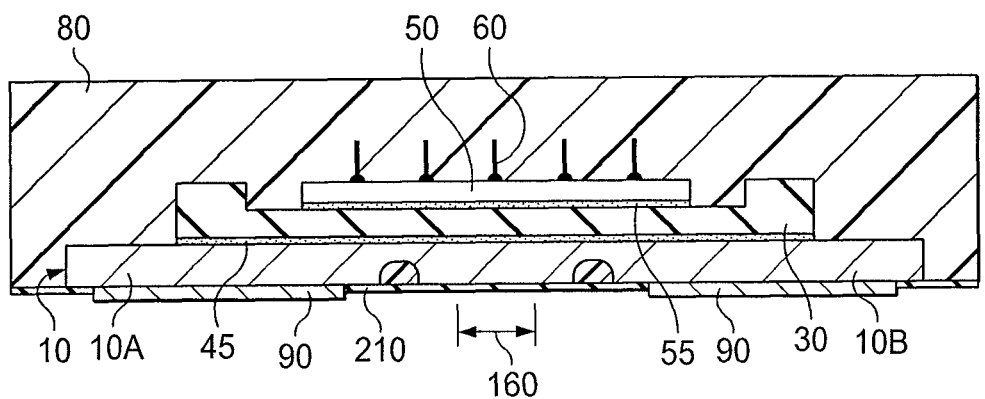

FIG. 5, which includes FIGS. 5A and 5B, illustrates a semiconductor package having an anti-solder layer in accordance with an alternative embodiment of the present invention. Thereby, in this illustration, the geometry of the current rail of FIG. 5A is similar to the illustration of FIG. 4. However, the anti-solder layer may be applied differently in other embodiments.

In this embodiment, a coating 210 is formed over portions of the exposed current rail. In one embodiment, the coating 210 may have an anti-wetting property so as to prevent the flow of solder material over the coating 210. Thus, during reflow, the solder 90 stays out of the regions coated with the coating 210.

Figure 5C:
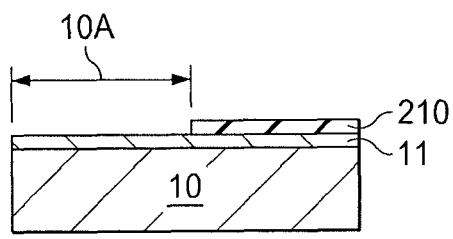

For example, as illustrated in FIG. 5C, in many embodiments, during fabrication, the current rail 10 may be lined with a solder promoting layer 11 such as tin, silver, palladium, and others depending on the material of the solder being used. This liner may promote the formation of the solder 90. In various embodiments, the coating 210 may block the exposure of this solder promoting layer 11 to the solder material thereby inhibiting the flow of the solder material, e.g., due to lack of wetting (large contact angle) between the solder material and the coating 210 in contrast to good wetting between the solder material and the solder promoting layer 11.

In various embodiments, the coating 210 may be a varnish comprising an organic polymer. In various embodiments, the coating 210 comprises a solder resist material and may be a UV or thermally cured solder mask material. The coating 210 may include filler materials such as silicon, aluminum, magnesium, titanium, calcium, for example. In alternative embodiments, the coating 210 may be formed by oxidizing a portion of the current rail 10 thereby forming a insulating metal oxide. In further alternative embodiments, the coating 210 may include oxide or nitrides such as copper oxide, hafnium oxide, titanium oxide, silicon oxide, silicon nitride and others.

In various embodiments, the coating 210 may be applied to form different designs. For example, as an illustration, in one example, the coating 210 may be applied to the surfaces of the constriction 160 in a current rail 10 as illustrated in FIG. 4. In another embodiment, the coating 210 may be applied to additional areas so that only rectangular contact areas over the first contact pad 10A and the second contact pad 10B remain exposed after the application of the coating 210.

FIG. 6, which includes FIGS. 6A and 6B, illustrate cross-sectional views of the semiconductor package mounted over a printed circuit board in accordance with embodiments of the invention. FIG. 6A illustrates a semiconductor package having a plurality of grooves or channels while FIG. 6B illustrates a semiconductor package having an anti-solder layer.

In various embodiments, the first contact pad 10A and the second contact pad 10B of the current rail 10 may have simple shapes like rectangles and may be smaller than the corresponding circuit contact areas 510 on a printed circuit board 500. Consequently, even in case of positional misalignment, the entire first and second contact pads 10A and 10B contacts the corresponding circuit contact areas 510 of the printed circuit board 500. In particular, in one or more embodiments, the spacing between the first contact pad 10A and the second contact pad 10B (d90) may be larger than the spacing between the corresponding two contact areas (d510) on the printed circuit board 500. Thus, mounting errors of the semiconductor package 1 on the printed circuit board 500 may not result in different current distribution in the current rail. In other words, advantageously, the calibration of the sensor chip 50 within the semiconductor package 1 is independent of the mounting of the package over the printed circuit board 500. This is because the entire first contact pad 10A contacts the circuit contact areas 510.

Additionally, the grooves help to further decouple the contact portion of the semiconductor package 1 from the field generating portion of the current rail 10 near the constriction 160. Any change in the exact contact geometry does not directly affect the current density distribution in the constriction 160 because the grooves are a kind of bottleneck that homogenizes the current distribution. In other words, as an example, the first groove 140 is an additional artificial constriction between the first contact pad 10A and the constriction 160. Therefore, the first groove 140 has a larger impact on the current distribution than small changes near the first contact pad 10A and in some cases may help to establish a boundary condition for the current distribution. Similarly, using the anti-solder coating described in prior embodiments, the distance between the constriction 160 and the first contact pad 10A may be increased so as to at least partially mitigate the change in contact resistance due to misalignment on the current distribution at the constriction 160.

In various embodiments, the semiconductor package 1 may be attached to the printed circuit board 500 by soft soldering. The first contact pad 10A and the second contact pad 10B may be attached to a circuit contact areas 510 on the printed circuit board 500. The circuit contact areas 510 may be a bus bar or a PCB-trace. Alternatively, in other embodiments, the contact between external conductor and the current rail 10 may be made via hard soldering, welding, clamping with bolts, and other techniques.

Accordingly, embodiments of the present invention describe a magnetic current sensor having a flat current rail 10 with a constriction 160 near at least one magnetic sensor element. In various embodiments, the contact interface between the current rail 10 and the printed circuit board 500 is decoupled from the field generating part of the current rail 10 so that small misalignments in the contact interface do not significantly affect the sensor reading. As described in various embodiments, this is accomplished by using at least two grooves in the bottom side of the current rail 10 or an anti-solder coating to space out the contact interface from the constriction 160.

Figure 7A:
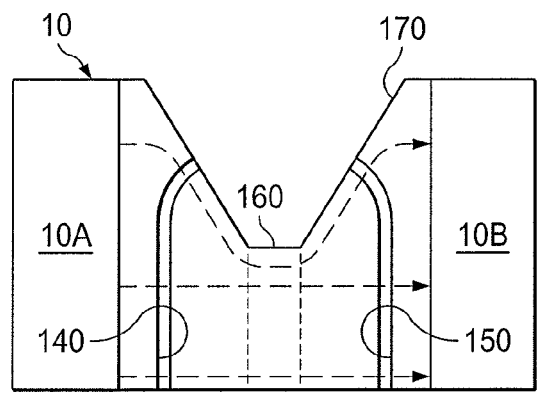
FIGS. 7A-7C, illustrates a top view of a current rail having grooves in accordance with alternative embodiments of the present invention.
Figure 7B:
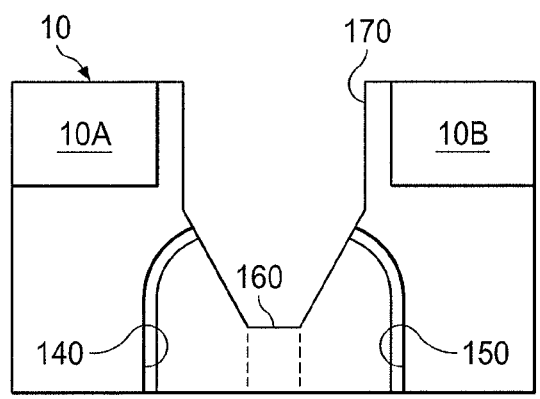
Figure 7C:
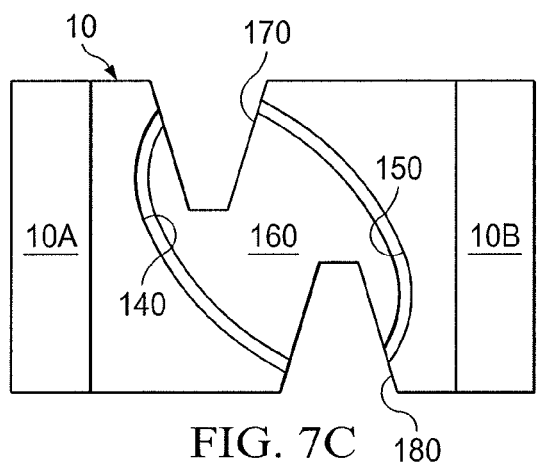

FIG. 7, which includes FIGS. 7A-7C, illustrates a top view of a current rail having grooves in accordance with alternative embodiments of the present invention.

In various embodiments, the current rail 10 may have different shapes to improve the sensitivity of the sensor within the sensor chip 50. Examples of the current rail 10 include the "I," "U," "S" shapes illustrated in FIGS. 7A-7C.

As illustrated in FIG. 7A, in one embodiment, the current rail 10 includes a first notch 170 defining a laterally reduced cross-sectional area (constriction 160). The reduced cross-section area forces the current flowing from the first contact pad 10A to the second contact pad 10B to flow "I" or line shape. The reduced cross-section and the bending of the current caused by the first notch 170 increases the current density at the constriction 160 and thus the magnetic field strength of the magnetic field. This increases the sensitivity of the current measurement. As illustrated, a first groove 140 and a second groove 150 may be formed as described in prior embodiments. In various embodiments, the design of the first groove 140 and a second groove 150 is made to ensure that the current flow lines remain perpendicular. For example, FIG. 7A illustrates a schematic current flow lines (dotted lines). The curvature of the first groove 140 and the second groove 150 ensures that the current flow lines are perpendicular to the cross-section of the current rail facing the current flow.

Referring to FIG. 7B, the current flow from the first contact pad 10A to the second contact pad 10B exhibits a "U" shaped current flow. Similar to the prior embodiment, the current rail 10 comprises a first notch 170 between the first contact pad 10A and the second contact pad 10B. However, in this embodiment the first and second contact pads 10A and 10B are arranged only on an opposite half of the current conductor. Thus, the current flowing from the first contact pad 10A to the second contact pad 10B is even more bent than in the prior embodiment. A first groove 140 and a second groove 150 may be formed as described in prior embodiments. The first and the second grooves 140 and 150 may be shorted in length providing a smaller resistance to current flow.

FIG. 7C illustrates a further alternative embodiment of the current rail with the groove. The embodiment illustrated in FIG. 7C has an "S"-shaped current flow. To achieve the S-shaped current flow, the magnetic field producing region comprises a first notch 170 and a second notch 180 arranged on opposite sides of the constriction 160 relative to the flow direction of the current and displaced or offset to each other in flow direction. The length of the first groove 140 and the second groove 150 may be longer than in prior embodiments providing a homogeneous current distribution through the constriction 160.

Figure 8A:
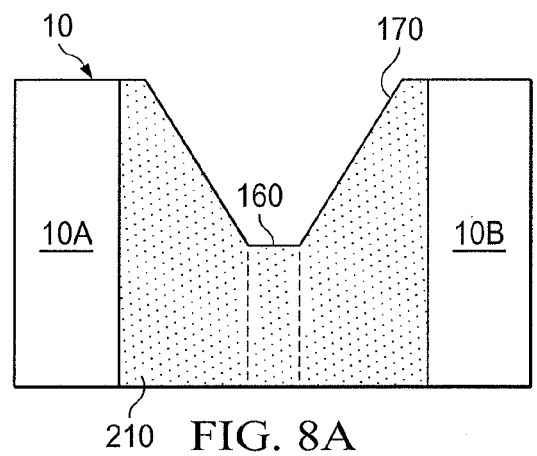
FIGS. 8A-8C, illustrates a top view of a current rail having an anti-solder layer in accordance with alternative embodiments of the present invention.
Figure 8B:
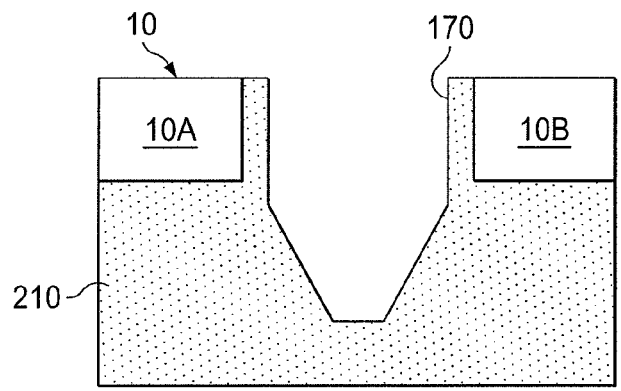
Figure 8C:
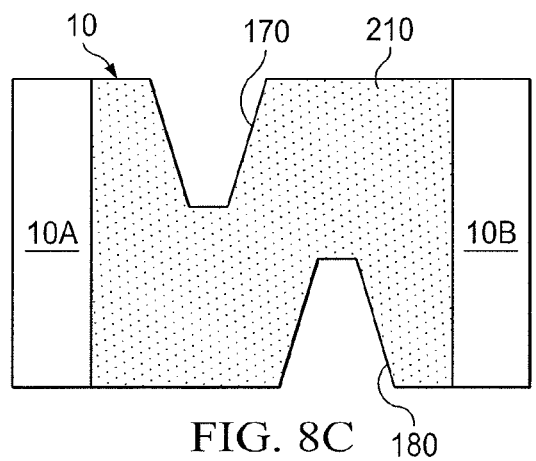

FIG. 8, which includes FIGS. 8A-8C, illustrates a top view of a current rail having an anti-solder layer in accordance with alternative embodiments of the present invention.

As described in FIG. 7, the current rail 10 may include the "I," "U," "S" shaped current flow structures. As also illustrated in FIG. 8, the coating 210, which may be an anti-solder layer, may be tailored for each of these structures.

Figure 9C:
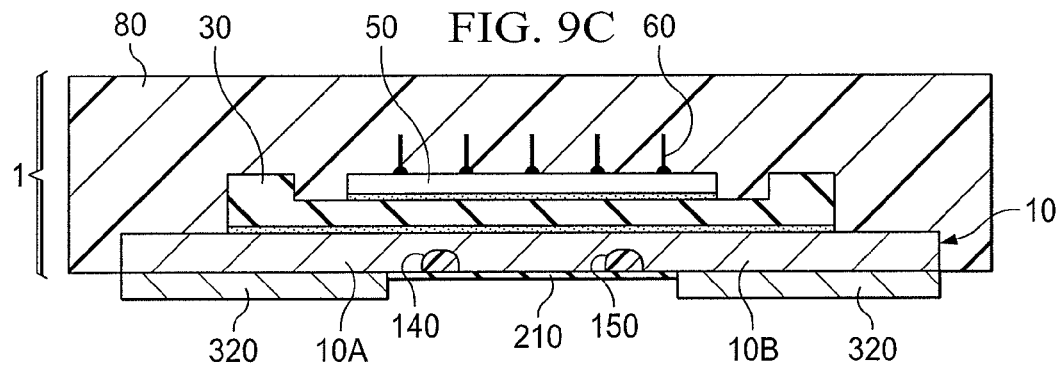

FIG. 9, which includes FIGS. 9A-9C, illustrates a semiconductor package during various stages of fabrication in accordance with embodiments of the present invention.

FIG. 9 illustrates the formation of a semiconductor device including a combination of the embodiments described previously. Referring to FIG. 9A, a lead frame strip substrate 300 is illustrated. The lead frame strip substrate 300 may have a constant thickness D1 and may comprise a metal such as copper.

Referring to FIG. 9B, the lead frame strip substrate 300 is etched fully to form a plurality of leads, a die paddle or current rail, which includes a constriction 160 (described previously). After or prior to forming the plurality of leads, the grooves may be formed by forming a first resist 310 and etching the lead frame strip substrate 300. In one or more embodiments, the first groove 140 and the second groove 150 may be formed during the formation of the plurality of leads. For example, to etch through completely, the lead frame strip substrate 300 is etched from the front side and the back side. The grooves may be formed during the back side etching process. Thus, no extra process step may be required in some embodiments. The lead frame strip thus formed may include a plurality of lead frame units.

As next illustrated in FIG. 9C, the current rail 10, a sensor chip 50, and an isolating structure 30 are packaged within a package body 20. A coating 210 is applied to the exposed back surface of the semiconductor package. In this context, the back surface may be a major surface of the package facing the circuit board or to a busbar which carry the current to be measured while the opposite front side of the semiconductor package may carry labels identifying the devices within the package. In some embodiments, a second resist 320 may be applied before forming the coating 210. In one or more embodiments, the solder material (prior to reflow) may be used as the second resist 320. Alternatively, the coating 210 may be printed, for example, using stencil printing, ink jet printing, and other dispensing techniques. The solder material may be applied either before or after applying the coating 210. Solder material is applied (if necessary).

A singulation process may be used to separate the plurality of semiconductor packages into individual units. In one embodiment, a dicing tool may be used to mechanically separate the lead frame strip substrate 300 to form physically separate semiconductor packages. Although a batch process is illustrated above, in various embodiments, a sequential process may be used in which each semiconductor package is fabricated separately.

Figure 10A:
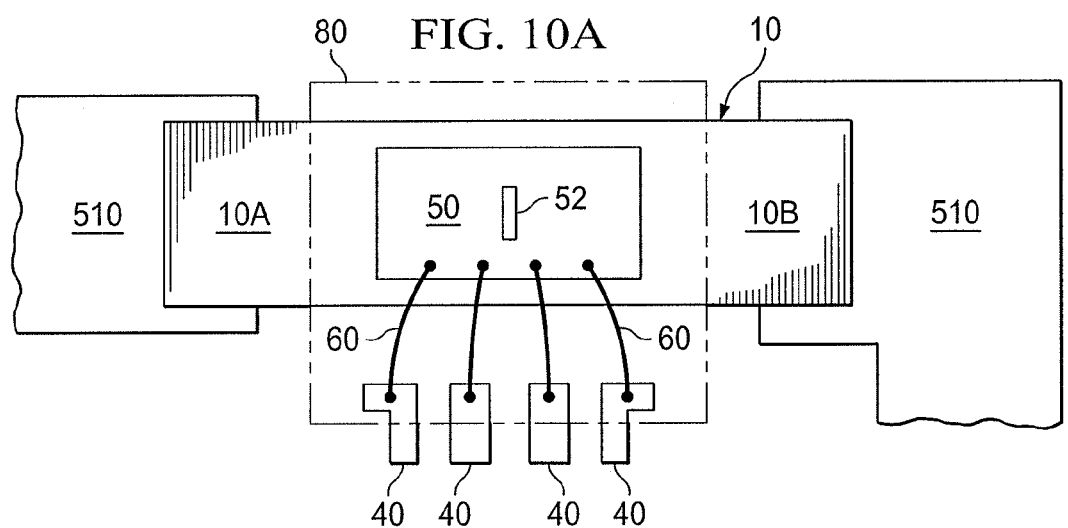
Figure 10B:
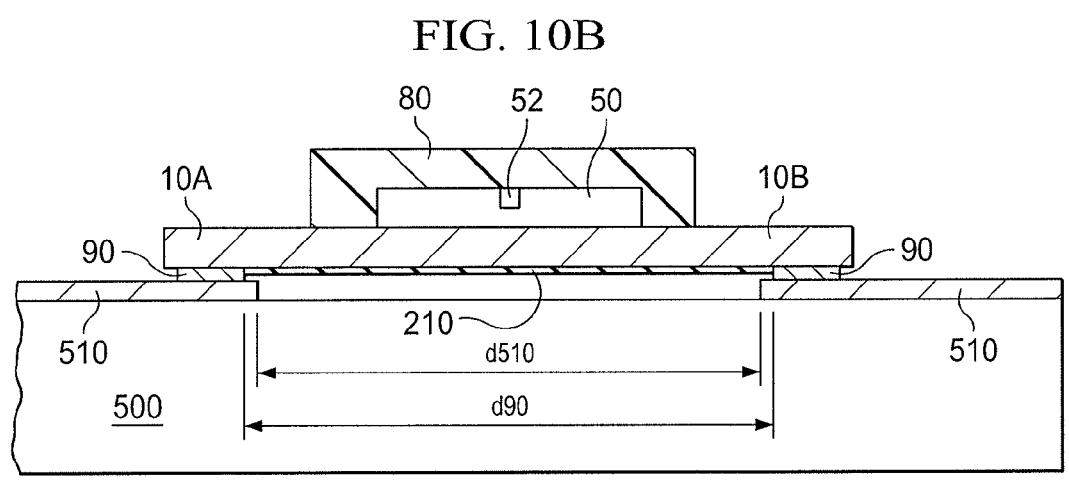

The individual semiconductor package may be positioned and mounted over a circuit board. A solder reflow process may be performed to form the joint;

FIG. 10, which includes FIGS. 10A and 10B, illustrates an alternative embodiment of the present invention using a current rail having no constriction, wherein FIG. 10 illustrates a top view while FIG. 10B illustrates a cross-sectional view.

Embodiments of the present invention may be applied to current rails 10 having no constriction. For example, flat current rails without a constriction may be used in some embodiments. As illustrated in FIG. 10, in one or more embodiments, the magnetic field generating portion may be a portion of the current rail 10 under the magnetic field sensor 52.

As illustrated in FIGS. 10A and 10B, a semiconductor chip 50 may be placed over the current rail 10 having a first contact pad 10A and a second contact pad 10B. The semiconductor chip 50 may include a magnetic field sensor 52, which detects the magnetic field due to current flowing in a portion of the current rail 10 under it. The semiconductor chip 50 may be coupled to a plurality of leads 40 through interconnects 60 as described earlier. The package body 80 secures the semiconductor chip 50 as described previously.

Referring to FIG. 10B, the semiconductor package is mounted over a printed circuit board 500 or a bus bar. A coating 210, which may comprise a solder resist material, may be applied over the exposed current rail 10 at the back side of the package facing the circuit board 500. However, the coating 210 does not cover the entire exposed surface of the current rail 10 leaving some portions of the current rail 10 exposed. The exposed portions of the current rail 10 may be attached to corresponding circuit contact areas 510.

In particular, in one or more embodiments, the coating 210 may be applied such that the spacing between the first contact pad 10A and the second contact pad 10B (d90) is larger than the spacing between the corresponding two contact areas (d510) on the printed circuit board 500. Thus, in various embodiments, the coating 210 may be used to selectively change the area of the current rail 10 exposed to form contact with the printed circuit board 500.

Figure 11A:
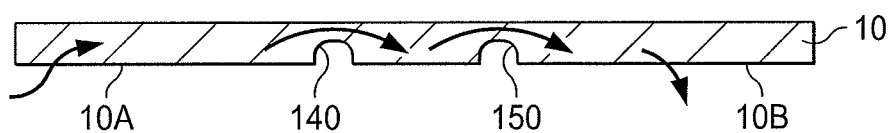
Figure 11B:
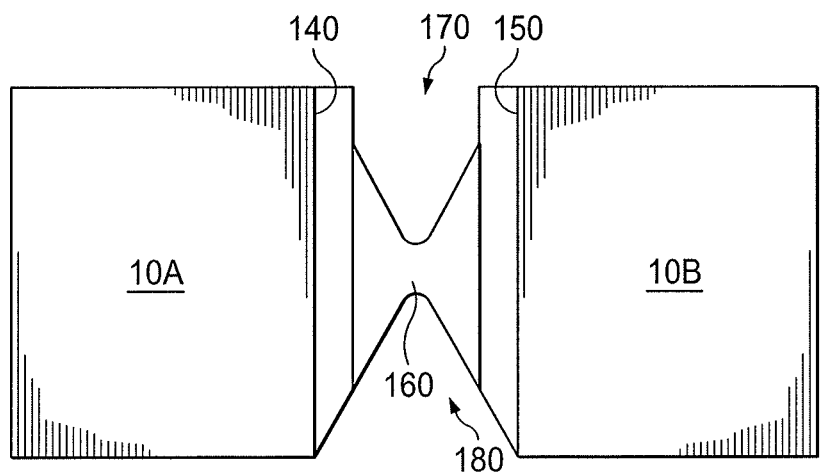

FIG. 11, which includes FIGS. 11A and 11B, illustrates an alternative embodiment of the current rail. FIG. 11A illustrates a cross-sectional view and FIG. 11B illustrates a top view.

Referring to FIG. 11A, the current rail 10 has a first groove 140 and a second groove 150. FIG. 11A also illustrates the current flow direction within the current rail 10. As illustrated in the plan view of FIG. 11B, the first groove 140 and the second groove 150 are formed as straight trenches. This is contrast with the prior embodiments in which the first groove 140 and the second groove 150 had a radius of curvature.

Figure 12A:
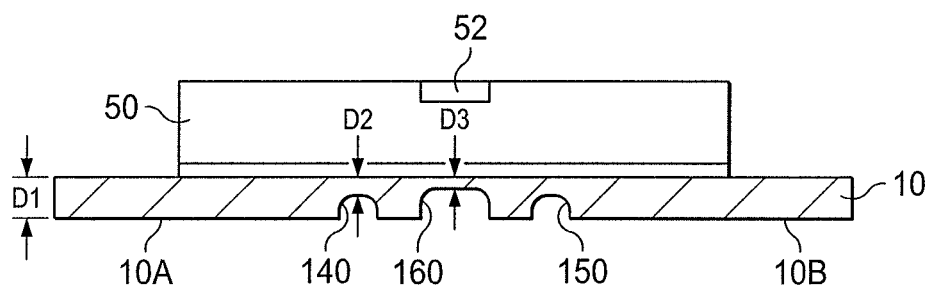
Figure 12B:
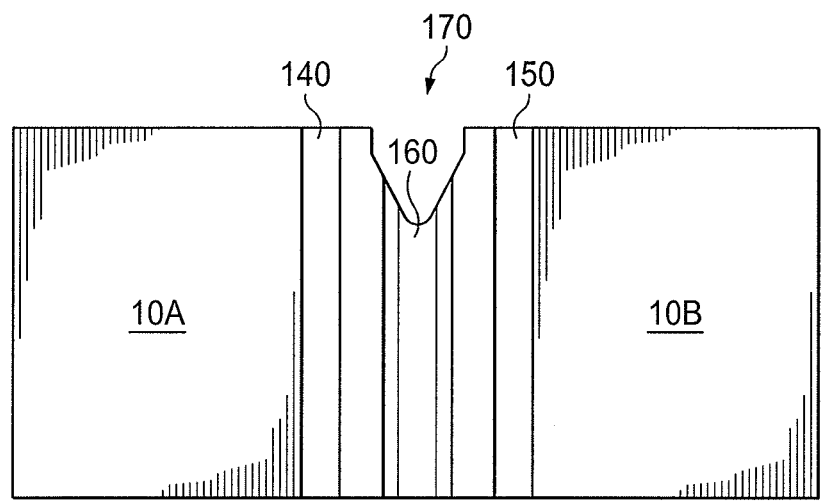

FIG. 12, which includes FIGS. 12A and 12B, illustrates a current rail having a half etched constriction in accordance with an alternative embodiment of the invention. FIG. 12A illustrates a cross-sectional view while FIG. 12B illustrates a top view.

Referring to FIG. 12A, the current rail 10 has a first thickness D1 (e.g., at the contact pad areas), the current rail 10 has a second thickness D2 at the first groove 140 and the second groove 150, and the current rail 10 has a third thickness D3 at the constriction 160. In one embodiment, the second thickness D2 and the third thickness D3 are about the same and about half the first thickness D1.

FIG. 12B illustrates a plan view and illustrates the constriction 160 formed using a first notch 170. In other embodiments, the constriction 160 may have different designs (e.g., as illustrated in FIGS. 7 and 8). Thus, the constriction 160 may be thinner than the current rail 10 in some embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1, 3-9 may be combined with each in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
a current rail comprising a first contact area and a second contact area, a first groove and a second groove, and a magnetic field generating portion, wherein, along a current flow direction, the first groove is disposed between the first contact area and the magnetic field generating portion and the second groove is disposed between the magnetic field generating portion and the second contact area, wherein a thickness of the current rail at the first groove is smaller than a thickness of the current rail at the first contact area.

2. The package of claim 1, wherein the first and the second contact areas and the first and the second grooves are in a same main surface of the current rail.

3. The package of claim 1, wherein a cross-sectional area of the current rail perpendicular to current flow lines is larger at the first and the second grooves than at the magnetic field generating portion.

4. The package of claim 1, wherein a thickness of the current rail at the first and the second grooves is smaller than a thickness of the current rail at the magnetic field generating portion.

5. The package of claim 1, wherein a thickness of the current rail at the first and the second grooves is smaller than a thickness of the current rail at the first and the second contact areas.

6. The package of claim 1, wherein the first and the second grooves extend substantially perpendicularly to current flow lines due to a current flowing between the first contact area and the second contact area.

7. The package of claim 1, wherein an entire current has to pass across both the first and the second grooves when a current enters at the first contact area and exits at the second contact area.

8. The package of claim 1, further comprising a semiconductor chip mounted parallel to the current rail.

9. The package of claim 8, further comprising a magnetic field sensor disposed within the semiconductor chip.

10. The package of claim 9, wherein the magnetic field sensor is disposed between the first and the second grooves in a plan view.

11. The package of claim 8, further comprising an isolation disposed between the semiconductor chip and the current rail.

12. The package of claim 8, further comprising:
a package body securing the current rail, and the semiconductor chip, wherein portions of a back surface of the current rail are exposed at a bottom surface of the package body; and
an anti-solder layer covering parts of the exposed portions of the back surface of the current rail, wherein the contact pad regions remain exposed.

13. The package of claim 12, wherein the anti-solder layer comprises a varnish layer.

14. The package of claim 1, wherein the current rail is a flat current rail.

15. The package of claim 1, wherein the magnetic field generating portion comprises a constriction.

16. The package of claim 1, wherein, along a current flow direction within the current rail, a resistance of the first groove is smaller than a resistance of the magnetic field generating portion.

17. The package of claim 1, wherein, a cross-sectional area of the current rail at the first groove along a surface perpendicular to current flow lines is larger than a cross-sectional area of the magnetic field generating portion along a surface perpendicular to current flow lines.

18. The package of claim 1, wherein the first groove comprises a first plurality of channels, and wherein the second groove comprises a second plurality of channels.

19. The package of claim 1, wherein a thickness of the current rail at an edge of the current rail is less than the thickness of the current rail between the first groove and the second groove.

20. The package of claim 1, wherein the current rail comprises a "I", "U", or "S" shape.

21. The package of claim 1, wherein the thickness of a region between the first groove and the second groove is less than the thickness of the current rail at the first contact area.

22. A semiconductor package comprising:
a current rail having contact pad regions and a magnetic field generating portion;
a semiconductor chip disposed over the current rail, the semiconductor chip comprising a magnetic field sensor, the magnetic field sensor being proximate the current rail;
a package body securing the current rail and the semiconductor chip, wherein portions of a back surface of the current rail are exposed at a bottom surface of the package body; and
an anti-solder layer covering first parts of the exposed portions of the back surface of the current rail.

23. The package of claim 22, wherein second parts of the exposed portions of the back surface of the current rail remain exposed.

24. The package of claim 22, further comprising a solder layer disposed on second parts of the exposed portions of the back surface of the current rail.

25. The package of claim 22, further comprising an isolating layer disposed between the current rail and the semiconductor chip.

26. The package of claim 22, wherein the anti-solder layer is configured to prevent a solder material from adhering to the first parts of the exposed portions of the back surface of the current rail.

27. The package of claim 22, wherein the anti-solder layer comprises a varnish, a polymer layer, or a solder resist material.

28. The package of claim 22, wherein the anti-solder layer comprises an insulating layer, wherein the insulating layer comprises a metal oxide layer, a metal nitride layer, or a metal oxynitride.

29. The package of claim 22, wherein a portion of the anti-solder layer separates the magnetic field generating portion from a pad of the contact pad regions.

30. The package of claim 22, wherein the magnetic field generating portion has a first width along a first direction, wherein a pad of the contact pad regions has a second width along the first direction, and wherein the first width is smaller than the second width.

31. The package of claim 22, wherein the current rail comprises a "I", "U", or "S" shape.

32. The package of claim 22, wherein the current rail comprises a rectangular shape with no constriction.

33. A system comprising:
a circuit board having solder pads; and
a semiconductor package coupled to the circuit board through the solder pads, wherein the semiconductor package comprises:
   a current rail having contact pad regions,
   a semiconductor chip disposed over the current rail, the semiconductor chip comprising a magnetic field sensor, the magnetic field sensor being proximate the current rail,
   a package body securing the current rail and the semiconductor chip, wherein portions of a back surface of the current rail are exposed at a bottom surface of the package body facing the circuit board, and
   an anti-solder layer covering parts of the exposed portions of the back surface of the current rail, wherein the solder pads of the circuit board are disposed under and coupled to the contact pad regions.

34. The system of claim 33, wherein a spacing between the solder pads of the circuit board is less than a spacing between the contact pad regions of the current rail.

35. The system of claim 33, wherein an area of a pad of the solder pads is larger than an area of a pad of the contact pad regions.

36. The system of claim 33, further comprising an isolating layer disposed between the current rail and the semiconductor chip.

37. The system of claim 33, wherein the anti-solder layer is configured to prevent a solder material from adhering to the exposed portions of the back surface of the current rail.

38. The system of claim 33, wherein the anti-solder layer comprises a varnish, a polymer layer, or a solder resist material.

39. The system of claim 33, wherein the anti-solder layer comprises a metal oxide layer, a metal nitride layer, or a metal oxynitride.

40. The system of claim 33, wherein the contact pad regions comprises a first contact area and a second contact area, wherein the current rail comprises a first groove and a second groove, and a magnetic field generating portion, wherein, along a current flow direction, the first groove is disposed between the first contact area and the magnetic field generating portion and the second groove is disposed between the magnetic field generating portion and the second contact area, wherein a thickness of the current rail at the first groove is smaller than a thickness of the current rail at the first contact area.

41. A system comprising:
a circuit board having solder pads; and
a semiconductor package coupled to the circuit board through the solder pads, wherein the semiconductor package comprises:
   a current rail comprising a first contact area and a second contact area, a first groove and a second groove, and a magnetic field generating portion, wherein, along a current flow direction, the first groove is disposed between the first contact area and the magnetic field generating portion and the second groove is disposed between the magnetic field generating portion and the second contact area, wherein a thickness of the current rail at the first groove is smaller than a thickness of the current rail at the first contact area.

* * * * *